US012719189B2

(12) United States Patent
Tang et al.

(10) Patent No.: US 12,719,189 B2
(45) Date of Patent: Aug. 25, 2026

(54) MULTI-PROCESSOR SERVER NODE CROSS-BOARD SIGNAL INTERCONNECTION DEVICE

(71) Applicant: SHANDONG YINGXIN COMPUTER TECHNOLOGIES CO., LTD., Shandong (CN)

(72) Inventors: Xuefei Tang, Shandong (CN); Hong Wang, Shandong (CN)

(73) Assignee: SHANDONG YINGXIN COMPUTER TECHNOLOGIES CO., LTD., Shandong (CN)

( * ) Notice: Subject to any disclaimer, the term of this patent is extended or adjusted under 35 U.S.C. 154(b) by 482 days.

(21) Appl. No.: 18/259,524

(22) PCT Filed: Feb. 28, 2022

(86) PCT No.: PCT/CN2022/078480
§ 371 (c)(1),
(2) Date: Jun. 27, 2023

(87) PCT Pub. No.: WO2022/199334
PCT Pub. Date: Sep. 29, 2022

(65) Prior Publication Data

US 2024/0072465 A1 Feb. 29, 2024

(30) Foreign Application Priority Data

Mar. 26, 2021 (CN) ......................... 202110327511.4

(51) Int. Cl.
*H01R 12/00* (2006.01)
*G06F 1/183* (2026.01)
(Continued)

(52) U.S. Cl.
CPC ........... *H01R 12/716* (2013.01); *G06F 1/183* (2013.01); *H01R 12/91* (2013.01); *H05K 7/1452* (2013.01); *H01R 2201/04* (2013.01)

(58) Field of Classification Search
CPC .. H01R 12/716; H01R 12/91; H01R 2201/04; H01R 12/73; H01R 24/00; H01R 13/502;
(Continued)

(56) References Cited

U.S. PATENT DOCUMENTS 4,237,546 A 12/1980 Wells et al.
6,273,742 B1 8/2001 Castagna et al.
(Continued)

FOREIGN PATENT DOCUMENTS

CN 101304543 A 11/2008
CN 102725924 A 10/2012
(Continued)

OTHER PUBLICATIONS

Search report for International Application No. PCT/CN2022/078480 mailed on May 6, 2022.
(Continued)

*Primary Examiner* — Abdullah A Riyami
*Assistant Examiner* — Nelson R. Burgos-Guntin
(74) *Attorney, Agent, or Firm* — Dennemeyer & Associates LLC

(57) ABSTRACT

Disclosed is a multi-processor server node cross-board signal interconnection device. The device includes a middle backboard, a plurality of first signal connectors arranged on a surface of the middle backboard, a plurality of second signal connectors arranged on a back surface of the middle backboard and having the same distribution region as all the first signal connectors, a plurality of signal leading-out terminals arranged on all node single boards and configured to be connected to all the second signal connectors, and a
(Continued)

plurality of signal interconnection cables connected between the second signal connectors. In this way, all the second signal connectors transmit signals on the middle backboard by means of the signal interconnection cables. All the second signal connectors and the first signal connectors are arranged in the same region, such that a risk of signal interference is eliminated.

19 Claims, 4 Drawing Sheets

(51) Int. Cl.
*H01R 12/71* (2011.01)
*H01R 12/91* (2011.01)
*H05K 7/14* (2006.01)

(58) Field of Classification Search
CPC ....... H01R 2201/06; G06F 1/183; G06F 1/18; G06F 1/189; G06F 13/385; H05K 7/1452; H05K 7/1492
See application file for complete search history.

(56) References Cited

U.S. PATENT DOCUMENTS 10,622,768 B1 * 4/2020 Cowham ................ H01R 24/28
2002/0090846 A1 * 7/2002 Abboud ............... G11B 33/126
2003/0003803 A1 * 1/2003 Billman ................. H05K 1/117 439/607.05
2006/0194472 A1 * 8/2006 Minich ................ H01R 12/724 439/552
2007/0279892 A1 * 12/2007 Della Fiora ........ H01R 12/7088 361/826
2009/0298349 A1 * 12/2009 Filipon ............. H01R 13/6658 439/669
2011/0039423 A1 * 2/2011 Blasick ................ H01R 24/545 439/65
2017/0352977 A1 * 12/2017 Knieriem ................. H04Q 1/06
2019/0027845 A1 * 1/2019 Hensley ............. H01R 12/7052
2019/0036248 A1 * 1/2019 Hensley ................... H05K 1/18
2019/0109408 A1 * 4/2019 Maddens ............... H01R 13/52

FOREIGN PATENT DOCUMENTS

CN 103718658 A 4/2014
CN 104064893 A 9/2014
CN 108270097 A 7/2018
CN 109994854 A 7/2019
CN 112152000 A 12/2020
CN 113067219 A 7/2021
WO 2017126186 A1 7/2017
WO 2018068276 A1 4/2018

OTHER PUBLICATIONS

First search report for Chinese application 202110327511.4, filed Mar. 26, 2021.
Second search report for Chinese application 202110327511.4, filed Mar. 26, 2021.

* cited by examiner

MULTI-PROCESSOR SERVER NODE CROSS-BOARD SIGNAL INTERCONNECTION DEVICE

CROSS-REFERENCE TO RELATED APPLICATIONS

This is a 35 U.S.C. 371 National Stage Patent Application of International Application No. PCT/CN2022/078480, filed Feb. 28, 2022, which claims priority to Chinese application 202110327511.4, filed Mar. 26, 2021, each of which is hereby incorporated by reference in its entirety.

TECHNICAL FIELD

The disclosure relates to the technical field of servers, and particularly to a multi-processor server node cross-board signal interconnection device.

BACKGROUND

The majority of traditional server motherboards are equipped with a single board and dual central processing units (CPUs), while a configuration of a single board and four CPUs is a ceiling on the industry. If critical application hosts require products with eight or more CPUs, the only way is to connect multiple single boards in series and parallel on the basis of the ultra path interconnect (UPI) technology. In addition, on the basis of 7×24 working environment and requirement of critical application hosts, products with eight or more CPUs are further required to modularize each node of critical application hosts and rapidly implement signal cross-board interconnection.

In the related art, signal interconnection of multi-node single boards is generally implemented by means of a middle backboard. Since the multi-node single boards are arranged on a surface and a back surface of the middle backboard, high-speed connectors used in large quantities are required to be mutually staggered on two sides of the middle backboard, so as to avoid signal overlap of front and rear multi-node single-board connectors. In a multi-node single-board interconnection solution implemented according to a traditional solution layout, a relatively large vertical middle backboard space is required, and more heat dissipation air ducts are sacrificed, which is inconducive to system heat dissipation and system stability.

Moreover, cross-board signal interconnection of the traditional multi-node single boards is implemented by means of horizontally arranged computing boards, vertically arranged middle backboards, and a large number of high-speed connectors. If cross-board signal interconnection is implemented only by means of traditional high-speed connectors, UPI high-speed signals led out by CPUs will be transferred through three motherboards and secondary high-speed connectors. In this way, multi-level transfer is caused, signal loss is increased, and a signal transmission rate is reduced. In particular, UPI signals cooperating with CPUs of multi-CPU products have stricter requirements on a signal transmission rate and signal quality.

Small signal loss and a rapid transmission rate may be ensured to a certain extent through a cable solution. However, if only cables are used for signal interconnection, an overlarge number of cables will be arranged, and a large number of cross-node cables will limit the layout of multi-node single boards, which cannot satisfy the requirements of rapid disassembly as well as hot maintenance and replacement.

Therefore, how to reduce occupation of mounting space on surfaces of two sides of a middle backboard and reduce a transfer level and loss of signal interconnection on the basis of implementing multi-processor server node cross-board signal interconnection, so as to facilitate rapid disassembly, assembly and maintenance is a technical problem faced by a person skilled in the art.

SUMMARY

Some embodiments of the disclosure is to provide a multi-processor server node cross-board signal interconnection, which may reduce occupation of mounting space on surfaces of two sides of a middle backboard and reduce a transfer level and loss of signal interconnection on the basis of implementing multi-processor server node cross-board signal interconnection device, so as to facilitate rapid disassembly, assembly and maintenance.

In order to solve the above technical problem, the disclosure provides a multi-processor server node cross-board signal interconnection device. The device includes a middle backboard, a plurality of first signal connectors arranged on a surface of the middle backboard, a plurality of second signal connectors arranged on a back surface of the middle backboard and having the same distribution region as all the first signal connectors, signal leading-out terminals arranged on all node single boards and configured to be connected to all the second signal connectors, and a plurality of signal interconnection cables connected between the second signal connectors.

In an embodiment mode, each of the plurality of first signal connectors is transversely mounted on the surface of the middle backboard in a horizontal direction, and each of the plurality of second signal connectors is longitudinally mounted on the back surface of the middle backboard in a vertical direction.

In an embodiment mode, each of the plurality of second signal connectors includes a connecting seat, and a connector female terminal arranged in the connecting seat and configured to match each of the plurality of signal leading-out terminals in a pluggable manner, and the connector female terminal is in signal connection with a corresponding signal interconnection cable of the plurality of signal interconnection cables.

In an embodiment mode, the connector female terminal is slidably arranged in the connecting seat, and the connector female terminal is detachably connected to the connecting seat by means of a floatable fastener.

In an embodiment mode, a side edge of the connector female terminal is provided with a reset elastic sheet capable of being reset through elastic deformation after the connector female terminal matches each of the plurality of signal leading-out terminals in a pluggable manner.

In an embodiment mode, all corners of the connecting seat are provided with positioning holes for being connected to the middle backboard by means of fasteners.

In an embodiment mode, each of the plurality of signal leading-out terminals includes a leading-out seat, and a connector male terminal arranged in the leading-out seat and configured to match the connector female terminal in a pluggable manner, and the connector male terminal is in signal connection with a corresponding node single board of all the node single boards.

In an embodiment mode, the connector male terminal is slidably arranged in the leading-out seat, and the connector male terminal is detachably connected to the leading-out seat by means of a floatable fastener.

In an embodiment mode, a side edge of the connector male terminal is provided with a reset elastic sheet capable of being reset through elastic deformation after the connector male terminal matches the connector female terminal in a pluggable manner.

In an embodiment mode, a bottom surface of the leading-out seat is provided with a plurality of mounting holes configured to be connected to the corresponding node single boards by means of fasteners.

The multi-processor server node cross-board signal interconnection device provided in the disclosure mainly includes a middle backboard, first signal connectors, second signal connectors, signal leading-out terminals and signal interconnection cables. The middle backboard is a main structure of the signal interconnection device, is located at side edges of all node single boards to be interconnected to each other, and is mainly configured to provide integrated mounting plates for the first signal connectors and the second signal connectors. All the first signal connectors are arranged on a surface of the middle backboard, and are mainly configured to be connected to the corresponding node single boards, so as to implement cross-board interconnection of signals of the node single boards. All the second signal connectors are arranged on a back surface of the middle backboard, and are mainly configured to be connected to the corresponding node single boards, so as to implement cross-board interconnection of signals of the node single boards. Importantly, a distribution region of each of the plurality of second signal connectors on the back surface of the middle backboard is the same as a distribution region of each of the plurality of first signal connectors on the surface of the middle backboard, such that all the first signal connectors and second signal connectors that correspond to each other actually share a mounting area of the same position on the middle backboard, thereby reducing occupation of mounting space on surfaces on two sides of the middle backboard. Moreover, the signal leading-out terminals are arranged on all the node single boards, and are mainly configured to be connected to all the second signal connectors, so as to transmit signals of all the node single boards to the second signal connectors, and all the second signal connectors (that are required to be interconnected to each other) are also connected to each other by means of signal interconnection cables. In this way, compared with the related art, signal interconnection of each of the plurality of second signal connectors is implemented not by means of inter-board signals on the middle backboard, and signal transmission is implemented by means of signal interconnection cables such that each of the plurality of second signal connectors is arranged in the same region as the first signal connectors, and a risk of signal interference is eliminated. Moreover, signal connection is only implemented between the second signal connectors by means of the signal interconnection cables, such that the number of used cables is reduced, and rapid disassembly, assembly and maintenance are facilitated. In addition, a signal interconnect path is optimized to: node single boards, second signal connectors, signal interconnection cables, second signal connectors and node single boards, and a signal link does not require inter-board transmission via the middle backboard, such that a transfer level and loss of signal interconnection are reduced.

BRIEF DESCRIPTION OF THE DRAWINGS

In order to illustrate technical solutions in examples of the disclosure or in the related art more clearly, accompanying drawings to be used in the description of the examples or the related art will be briefly introduced below. Obviously, the accompanying drawings in the following description only show the examples of the disclosure, and those of ordinary skilled in the art would have derived other accompanying drawings on the basis of these provided accompanying drawings without involving any inventive effort.

In FIGS. 1-4:

node single board13 a;

middle backboard—1, first signal connector—2, second signal connector—3, signal leading—out terminal—4, signal interconnection cable—5, floatable fastener—6 and reset elastic sheet—7; and connecting seat—31, connector female terminal—32, positioning hole—33, leading—out seat—41, connector male terminal—42 and mounting hole—43.

DETAILED DESCRIPTION OF THE EMBODIMENTS

The technical solutions of examples of the disclosure will be clearly and completely described in combination with accompanying drawings of the examples of the disclosure. Obviously, the examples described are merely some examples rather than all examples of the disclosure. On the basis of examples of the disclosure, all other examples obtained by those of ordinary skill in the art without involving any inventive effort fall within the scope of protection of the disclosure.

Figure 1:
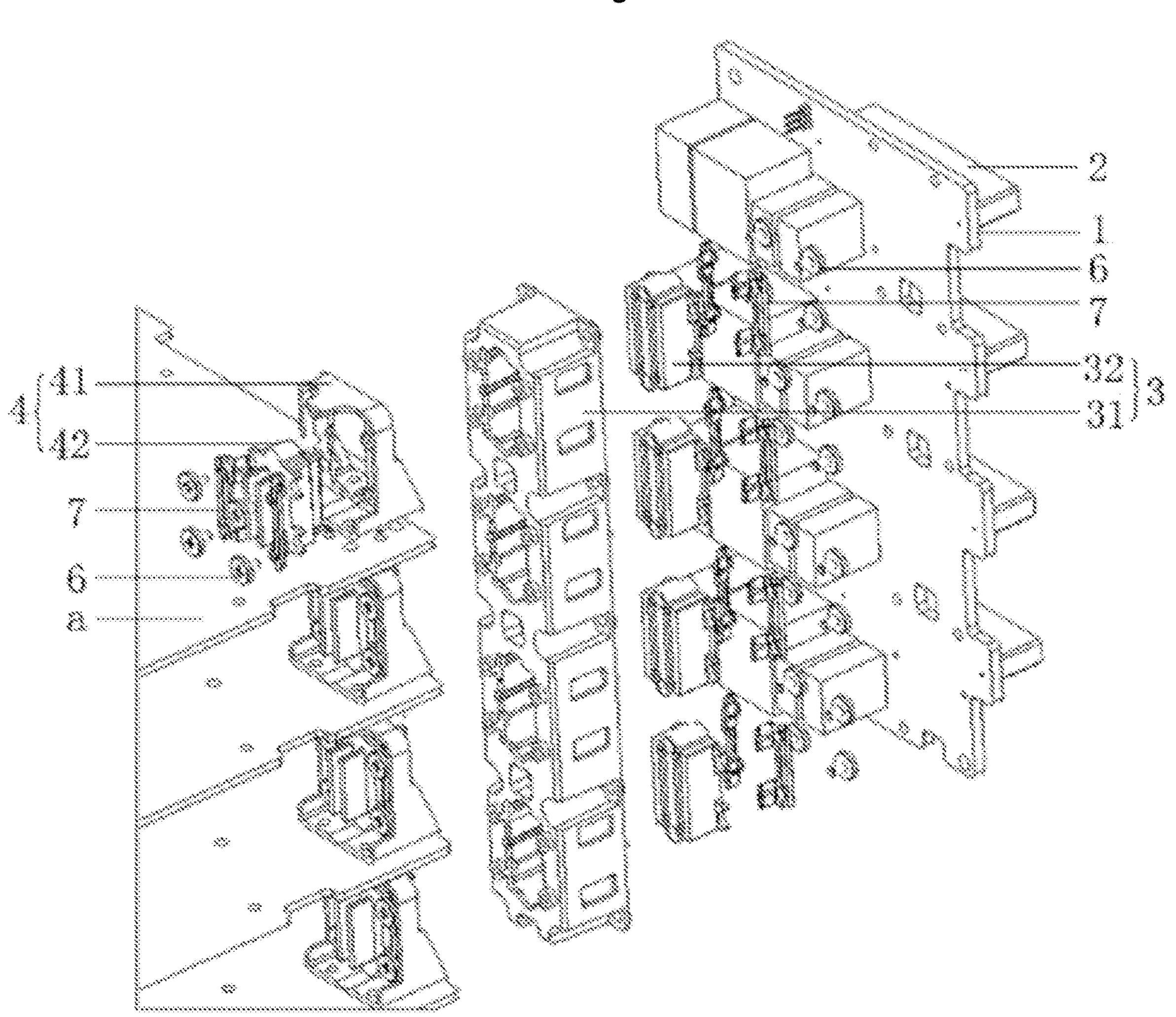
FIG. 1 is an exploded schematic structural diagram according to a particular embodiment of the disclosure.

With reference to FIG. 1, a schematic diagram of an entire structure according to a particular embodiment of the disclosure is shown in FIG. 1.

In a particular embodiment of the disclosure, a multi-processor server node cross-board signal interconnection device mainly includes a middle backboard 1, first signal connectors 2, second signal connectors 3, signal leading-out terminals 4 and signal interconnection cables 5.

The middle backboard 1 is a main structure of the signal interconnection device, is located at side edges of all node single boards a to be interconnected to each other, and is mainly configured to provide integrated mounting plates for the first signal connectors and the second signal connectors 3. Generally, since the plurality of node single boards a are generally horizontally distributed in a vertical direction, for convenience of connection, in an embodiment, a vertical board is selected as the middle backboard 1. Moreover, in order to increase an area utilization rate of side surfaces (that is, a "surface" and a "back surface") on two sides of the middle backboard 1, a surface space of the middle backboard 1 is mainly configured to implement interconnection between node single boards a on this side, and a back surface space of the middle backboard 1 is mainly configured to implement interconnection between node single boards a on the other side.

All the first signal connectors 2 are arranged on a surface of the middle backboard 1, and are mainly configured to be connected to the corresponding node single boards a, so as to implement cross-board interconnection of signals of the node single boards on this side.

All the second signal connectors 3 are arranged on a back surface of the middle backboard 1, and are mainly configured to be connected to the corresponding node single boards a, so as to implement cross-board interconnection of signals of the node single boards on this side.

Importantly, a distribution region of each of the second signal connectors 3 on the back surface of the middle backboard 1 is the same as a distribution region of each of the first signal connectors 2 on the surface of the middle backboard 1, such that all the first signal connectors 2 and second signal connectors 3 that correspond to each other actually share a mounting area of the same position on the middle backboard 1, thereby reducing occupation of mounting space on surfaces of two sides of the middle backboard 1.

Moreover, the signal leading-out terminals 4 are arranged on all the node single boards a, and are mainly configured to be connected to all the second signal connectors 3, so as to transmit signals of all the node single boards a to the second signal connectors 3, and all the second signal connectors 3 (that are required to be interconnected to each other) are also connected to each other by means of signal interconnection cables 5.

In this way, compared with the related art, signal interconnection of each of the second signal connectors 3 is implemented not by means of inter-board signals on the middle backboard 1, and signal transmission is implemented by means of signal interconnection cables 5 such that all the second signal connectors 3 are arranged in the same region as the first signal connectors 2, and a risk of signal interference is eliminated. Moreover, signal connection is only implemented between the second signal connectors 3 by means of the signal interconnection cables 5, such that the number of used cables is reduced, and rapid disassembly, assembly and maintenance are facilitated.

In addition, a signal interconnection path is optimized to: node single boards a, second signal connectors 3, signal interconnection cables 5, second signal connectors 3 and node single boards a, and a signal link does not require inter-board transmission via the middle backboard 1, such that a transfer level and loss of signal interconnection are reduced.

Figure 2:
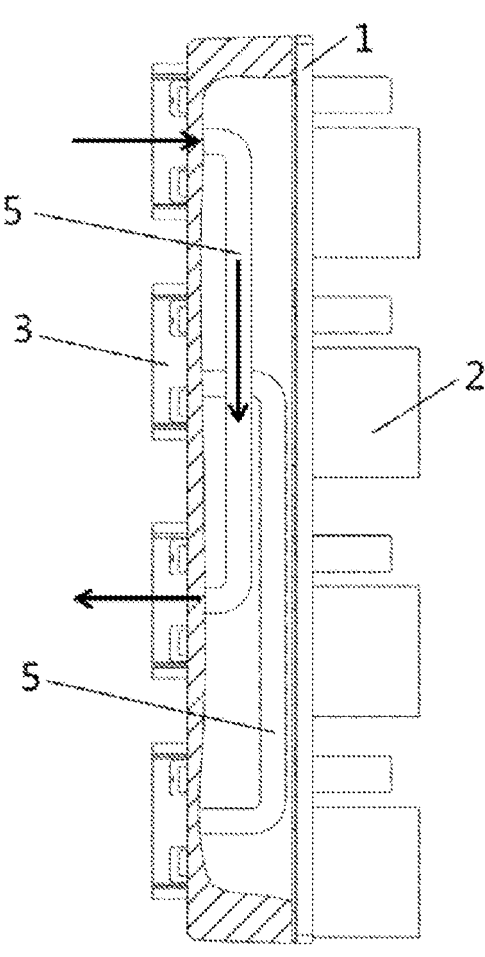
FIG. 2 is a schematic structural diagram of distribution of signal interconnection cables on a middle backboard.

As shown in FIG. 2, a schematic structural diagram (arrows in the figure indicate signal flow) of distribution of signal interconnection cables 5 on a middle backboard 1 is shown in FIG. 2.

It should be noted that the signal interconnection cable 5 is not limited to "one-to-one" signal interconnection between a certain node single board a and another node single board a, and may be "one-to-many" or similar "many-to-many" signal interconnection between a certain node single board a and a plurality of other node single boards a.

In an example of the first signal connector 2 and the second signal connector 3, in order to rapidly distinguish two parts of node single boards a to be interconnected and prevent connection confusion, in the example, each of first signal connectors 2 is transversely mounted on the surface of the middle backboard 1 in a horizontal direction. For example, four first signal connectors 2 are all arranged in a horizontal direction and hierarchically distributed in a vertical direction. Moreover, each of the second signal connectors 3 is longitudinally mounted on a back surface of the middle backboard 1 in a vertical direction. For example, four second signal connectors are all arranged in the vertical direction and hierarchically distributed in the vertical direction.

Figure 3:
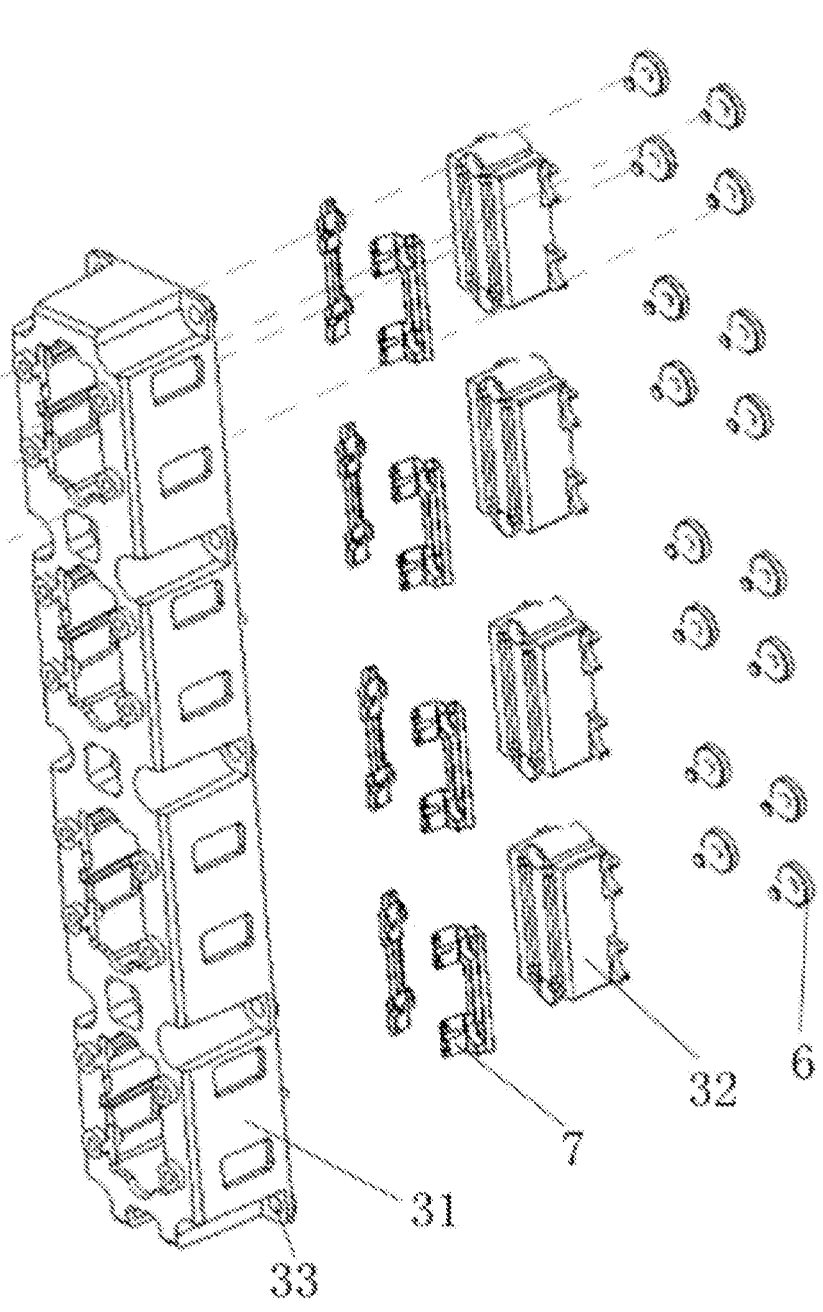
FIG. 3 is an exploded view of a specific structure of a second signal connector.

As shown in FIG. 3, an exploded view of a specific structure of a second signal connector 3 is shown in FIG. 3.

In an example of the second signal connector 3, the second signal connector 3 mainly includes a connecting seat 31 and a connector female terminal 32. The connecting seat 31 is a main structure of the second signal connector 3, and generally is of a rectangular frame structure. A through hole is provided in the connecting seat for the signal interconnection cable 5 between all the second signal connectors 3 to pass through. The connector female terminal 32 is arranged in the connecting seat 31, and has a front end surface mainly configured to match the signal leading-out terminal 4 in a pluggable manner for signal transmission. Moreover, a rear end surface of the connector female terminal 32 is mainly configured to be connected to the corresponding signal interconnection cable 5.

In order to facilitate disassembly and maintenance of the connector female terminal 32 in the connecting seat 31, in the example, the connector female terminal 32 is slidably mounted in the connecting seat 31. A mounting groove is provided in the connecting seat 31 in a disassembly direction, and the connector female terminal 32 is arranged in the mounting groove and may slide within a certain stroke in a length direction of the mounting groove. In order to ensure mounting stability of the connector female terminal 32 in the connecting seat 31, in the example, the floatable fastener 6 is configured to connect the connector female terminal 32 to the connecting seat 31. The floatable fastener 6 is generally a fastener such as a bolt with a spring, the connector female terminal 32 is locked on the connecting seat 31 through screw connection, and the connector female terminal 32 may maintain a certain degree of freedom of slide by means of elasticity of the spring.

Further, considering that when the connector female terminal 32 matches each of the signal leading-out terminals 4 in a pluggable manner, a mounting position of the connector female terminal 32 may have a displacement deviation under the influence of a positive pluggable connection force, subsequent pluggable connection stability may be affected. In view of this, in the example, reset elastic sheets 7 are additionally arranged on side edges on two sides of the connector female terminal 32. The reset elastic sheets 7 abut against a position between the connector female terminal 32 and the connecting seat 31. When the connector female terminal 32 is displaced under the influence of the pluggable connection force of each of the signal leading-out terminals 4, the reset elastic sheets 7 are elastically compressed, such that when the connector female terminal 32 is disconnected from each of the signal leading-out terminals 4, the connector female terminal 32 is reset under elastic forces of the elastic sheets.

Moreover, in order to facilitate rapid disassembly, assembly and maintenance of the connecting seat 31 on the middle backboard 1, in the example, all corners of the connecting seat 31 are provided with positioning holes 33, so as to implement accurate positioning and connection between the connecting seat 31 and the middle backboard 1 through the cooperation of fasteners such as bolts and positioning columns with the positioning holes 33.

Figure 4:
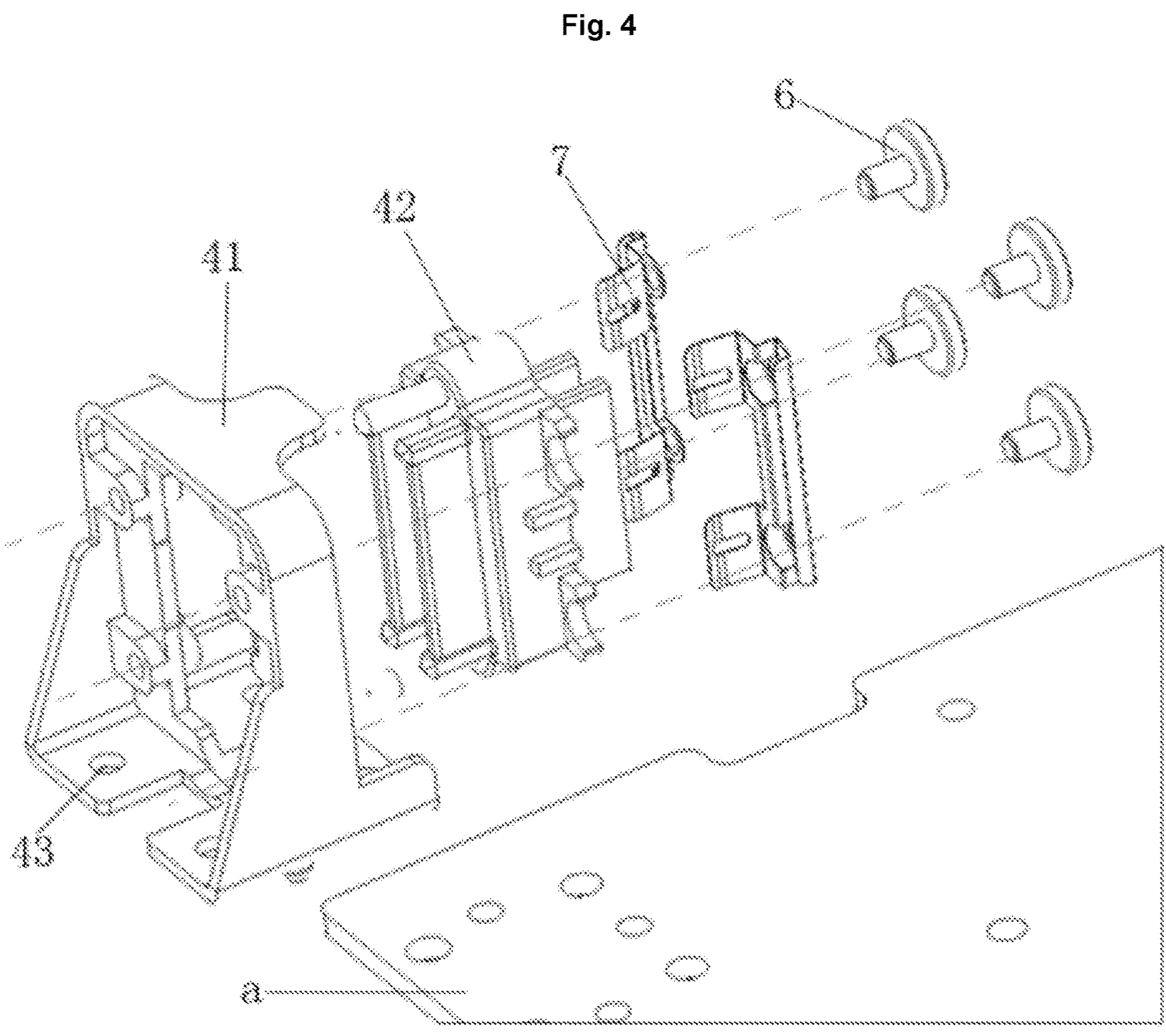
FIG. 4 is an exploded view of a specific structure of a signal leading-out terminal.

As shown in FIG. 4, an exploded view of a specific structure of a signal leading-out terminal 4 is shown in FIG. 4.

In an example of the signal leading-out terminal 4, the signal leading-out terminal 4 mainly includes a leading-out seat 41 and a connector male terminal 42. The leading-out seat 41 is a main structure of the signal leading-out terminal 4, is generally arranged at an edge of a surface of each node single board a, and is generally of a rectangular frame structure. The connector male terminal 42 is arranged in the leading-out terminal, and is mainly configured to match the connector female terminal 32 in each of second signal connectors 3 in a pluggable manner. Generally, in an embodiment, the connector female terminal 32 is a receptacle structure, and the connector male terminal 42 is a plug structure. Moreover, the connector male terminal 42 is further in signal connection with the node single board a, so as to transmit signals of components such as a central processing unit (CPU) on the node single board a to the connector female terminal 32, and then is in ultra path interconnect (UPI) to a CPU on another node single board a. In an embodiment, a tail of the connector male terminal 42 is connected to a corresponding region on the node single board a by means of a high-speed signal cable.

In order to facilitate disassembly, assembly and maintenance of the connector male terminal 42 in the leading-out seat 41, in the example, the connector male terminal 42 is able to slidably mount in the leading-out seat 41. In an embodiment, a mounting groove is provided in the leading-out seat 41 in a disassembly direction, and the connector male terminal 42 is arranged in the mounting groove and may slide within a certain stroke in a length direction of the mounting groove. In order to ensure mounting stability of the connector male terminal 42 in the leading-out seat 41, in the example, the floatable fastener 6 is configured to connect the connector male terminal 42 to the leading-out seat 41. The floatable fastener 6 is generally a fastener such as a bolt with a spring, the connector female terminal 42 is locked on the leading-out seat 41 through screw connection, and the connector male terminal 42 may maintain a certain degree of freedom of slide by means of elasticity of the spring.

Further, considering that when the connector male terminal 42 matches the connector female terminal 32 in a pluggable manner, a mounting position of the connector male terminal 42 may have a displacement deviation under the influence of a positive pluggable connection force, subsequent pluggable connection stability may be affected. In view of this, in the example, reset elastic sheets 7 are additionally arranged on side edges on two sides of the connector male terminal 42. The reset elastic sheets 7 abut against a position between the connector male terminal 42 and the leading-out seat 41. When the connector male terminal 42 is displaced under the influence of the pluggable connection force of the connector female terminal 32, the reset elastic sheets 7 are elastically compressed, such that when the connector male terminal 42 is disconnected from the connector female terminal 32, the connector male terminal 42 is reset under the elastic force of the elastic sheets.

Moreover, in order to facilitate rapid disassembly, assembly and maintenance of the leading-out seat 41 on the node single board a, in the example, a plurality of mounting holes 43 are provided on a bottom surface of a bottom plate of the leading-out seat 41, so as to implement detachable connection with the node single board a by means of fasteners such as bolts and rivets.

The above description of the disclosed examples enables professionals skilled in the art to achieve or use the disclosure. Various modifications to these examples are readily apparent to professionals skilled in the art, and the general principles defined herein may be implemented in other examples without departing from the spirit or scope of the disclosure. Therefore, the disclosure is not limited to these examples shown herein but falls within the widest scope consistent with the principles and novel features disclosed herein.

What is claimed is:

1. A multi-processor server node cross-board signal interconnection device, comprising a middle backboard, a plurality of first signal connectors arranged on a surface of the middle backboard, a plurality of second signal connectors arranged on a back surface of the middle backboard and having the same distribution region as all the first signal connectors, a plurality of signal leading-out terminals arranged on all node single boards and configured to be connected to all the second signal connectors, and a plurality of signal interconnection cables connected between all the second signal connectors;

wherein each of the plurality of second signal connectors comprises a connector female terminal configured to match each of the plurality of signal leading-out terminals in a pluggable manner;

wherein a side edge of the connector female terminal is provided with a reset elastic sheet capable of being reset through elastic deformation after the connector female terminal matches each of the plurality of signal leading-out terminals in a pluggable manner.

2. The multi-processor server node cross-board signal interconnection device according to claim 1, wherein each of the plurality of first signal connectors is transversely mounted on the surface of the middle backboard in a horizontal direction, and each of the plurality of second signal connectors is longitudinally mounted on the back surface of the middle backboard in a vertical direction.

3. The multi-processor server node cross-board signal interconnection device according to claim 1, wherein each of the plurality of second signal connectors comprises a connecting seat, the connector female terminal is arranged in the connecting seat, interconnection cable of the plurality of signal interconnection cables.

4. The multi-processor server node cross-board signal interconnection device according to claim 3, wherein the connector female terminal is slidably arranged in the connecting seat, and the connector female terminal is detachably connected to the connecting seat by means of a floatable fastener.

5. The multi-processor server node cross-board signal interconnection device according to claim 1, wherein all corners of the connecting seat are provided with positioning holes for being connected to the middle backboard by means of fasteners.

6. The multi-processor server node cross-board signal interconnection device according to claim 3, wherein each of the plurality of signal leading-out terminals comprises a leading-out seat and a connector male terminal arranged in the leading-out seat and configured to match the connector female terminal in a pluggable manner, and the connector male terminal is in signal connection with a corresponding node single board of all the node single boards.

7. The multi-processor server node cross-board signal interconnection device according to claim 6, wherein the connector male terminal is slidably arranged in the leading-out seat, and the connector male terminal is detachably connected to the leading-out seat by means of a floatable fastener.

8. The multi-processor server node cross-board signal interconnection device according to claim 7, wherein a side edge of the connector male terminal is provided with a reset elastic sheet capable of being reset through elastic deformation after the connector male terminal matches the connector female terminal in a pluggable manner.

9. The multi-processor server node cross-board signal interconnection device according to claim 8, wherein a bottom surface of the leading-out seat is provided with a plurality of mounting holes configured to be connected to the corresponding node single boards by means of fasteners.

10. The multi-processor server node cross-board signal interconnection device according to claim 1, wherein the middle backboard is located at side edges of all the node single boards to be interconnected to each other.

11. The multi-processor server node cross-board signal interconnection device according to claim 1, wherein the multi-processor server node cross-board signal interconnection device is provided with a signal interconnection path, the signal interconnection path is formed by the node single boards, the plurality of second signal connectors, the plurality of signal interconnection cables, the plurality of second signal connectors and the node single boards, such that a transfer level and loss of signal interconnection are reduced.

12. The multi-processor server node cross-board signal interconnection device according to claim 1, wherein the plurality of signal interconnection cables are configured to signal interconnection between one of the node single boards and another of the node single boards.

13. The multi-processor server node cross-board signal interconnection device according to claim 1, wherein the plurality of signal interconnection cables are configured for signal interconnection between one of the node single boards and others of the node single boards.

14. The multi-processor server node cross-board signal interconnection device according to claim 1, wherein the plurality of signal interconnection cables are configured for signal interconnection between some of the node single boards and others of the node single boards.

15. The multi-processor server node cross-board signal interconnection device according to claim 3, wherein the connecting seat is a rectangular frame structure, a through hole is provided in the connecting seat for the plurality of signal interconnection cables between the plurality of second signal connectors to pass through.

16. The multi-processor server node cross-board signal interconnection device according to claim 3, wherein a front end surface of the connector female terminal is configured to match each of the plurality of signal leading-out terminals in the pluggable manner;

a rear end surface of the connector female terminal is configured to be connected to the corresponding signal interconnection cable.

17. The multi-processor server node cross-board signal interconnection device according to claim 3, wherein the floatable fastener is a bolt with a spring.

18. The multi-processor server node cross-board signal interconnection device according to claim 6, wherein the leading-out seat is arranged at an edge of a surface of each of the plurality of node single boards, and the leading-out seat is a rectangular frame structure.

19. The multi-processor server node cross-board signal interconnection device according to claim 6, wherein the connector female terminal is a receptacle structure, and the connector male terminal is a plug structure.

* * * * *